United States Patent [19]
Kitano

[11] Patent Number: 5,419,808
[45] Date of Patent: May 30, 1995

[54] ETCHING SOLUTION AND ETCHING METHOD FOR SEMICONDUCTORS

[75] Inventor: Toshiaki Kitano, Itami, Japan

[73] Assignee: Mitsubishi Denki Kabushiki Kaisha, Tokyo, Japan

[21] Appl. No.: 155,325

[22] Filed: Nov. 22, 1993

[30] Foreign Application Priority Data

Mar. 19, 1993 [JP] Japan .................................. 5-059758

[51] Int. Cl.$^6$ ........................ C09K 13/00; H01L 21/00
[52] U.S. Cl. ................................. 156/656.1; 252/79.1
[58] Field of Search ............... 156/662, 656, 652, 655; 252/79.1, 79.5; 437/225

[56] References Cited

U.S. PATENT DOCUMENTS

| | | | |
|---|---|---|---|
| 4,814,293 | 3/1989 | Van Oekel | 156/664 X |
| 5,110,765 | 5/1992 | Bilakanti et al. | 437/225 |

FOREIGN PATENT DOCUMENTS

| | | |
|---|---|---|
| 63-29518 | 2/1983 | Japan . |
| 63-62235 | 3/1988 | Japan . |
| 2206117 | 8/1990 | Japan . |
| 4261082 | 9/1992 | Japan . |
| 5275415 | 10/1993 | Japan . |

OTHER PUBLICATIONS

Broekaert et al, "Novel, Organic Acid-Based Etchants for InGaAlAs/InP heterostructure Devices with AlAs Etch-Stop layers", J. Electro Chem. Soc., vol. 139, No. 8, pp. 2306-2309, Aug. 1992.

DeSalvo et al, "Etch Rates and Selectivities of Citric Acid/Hydrogen Peroxide on GaAs, $Al_{0.3}Ga_{0.7}As$, $In_{0.2}Ga_{0.8}As$, $In_{0.53}Ga_{0.47}As$, $In_{0.52}Al_{0.48}As$, and InP", J. Electrochem. Soc., vol. 139, No. 3, pp. 831-835, Mar. 1992.

LePore, "An Improved Technique For Selective Etching . . .", Journal of Applied Physics, vol. 51, No. 12, 1980, pp. 6441-6442.

Hill et al, "Two Selective Etching Solutions For GaAs On InGaAs and GaAs/AlGaAs on InGaAs", Journal of the Electrochemical Society, vol. 137, No. 9, 1990, pp. 2912-2914.

Logan et al., "Optical Waveguide In GaAs-AlGaAs Epitaxial Layers", Journal of Applied Physics, vol. 44, No. 9, 1973, pp. 4172-4176.

Tonobe et al., "Etching and Optical Characteristics in GaAs/GaAlAs Surface Emitting Laser Fabrication Using a Novel Etch," Japanese Journal of Applied Physics, vol. 31, No. 5B, May 1992, Tokyo, Japan, pp. 1597-1601.

*Primary Examiner*—Thi Dang
*Attorney, Agent, or Firm*—Leydig, Voit & Mayer

[57] ABSTRACT

An etchant includes an organic acid and hydrogen peroxide mixed in a volume ratio of 1:1 to 200:1 with a basic material added to adjust the pH. The etching solution presents an eminent difference in the etching rates between GaAs/AlGaAs, GaAs/InGaAs, AlGaAs/InGaAs, InGaAs/AlGaAs, and InGaAs/GaAs. High selectivity etching is completed easily and with high precision. Precise control of etching of a heterostructure is achieved.

15 Claims, 16 Drawing Sheets

ETCHING SOLUTION AND ETCHING METHOD FOR SEMICONDUCTORS

FIELD OF THE INVENTION

The present invention relates to etching solution used for etching semiconductors and etching method using this etching solution.

BACKGROUND OF THE INVENTION

Conventionally, acid and hydrogen peroxide, base and hydrogen peroxide, or an oxidation-reduction pair are employed as etching solutions for etching semiconductors. FIG. 17 is a cross sectional view illustrating a semiconductor device to which an etching is carried out using a prior art etching solution. In the figure, reference numeral 1 designates an n type AlGaAs layer. An n+ type GaAs layer 2 is disposed on the n type AlGaAs layer 1. A photoresist 3 is disposed on the n+ type GaAs layer 2. Reference character d designates an etching depth to which the n+ type GaAs layer 2 is etched and reference character Δd designates an over etching depth by which the n type AlGaAs layer 1 is excessively etched.

FIG. 18 is a cross sectional view illustrating an HEMT (high electron mobility transistor) produced by employing a prior art etching solution. In the figure, the same reference numerals as in FIG. 17 designate the same elements. Reference numeral 4 designates a GaAs substrate. An intrinsic (i type) GaAs layer 5 is disposed on the GaAs substrate 4. An i type InGaAs layer 6 is disposed on the i type GaAs layer 5. The n type AlGaAs layer 1 and the n+ type GaAs layer 2 are disposed on the i type GaAs layer 5 in FIG. 17. A drain electrode 7 and a source electrode 8 are disposed on the n+ type GaAs layer 2.

The threshold voltage $V_{th}$ of this HEMT is represented by the following formula (1):

$$V_{th} = \phi_B - \frac{q N_D W^2}{2\epsilon} - \Delta E_c \quad (1)$$

where
- $\phi_B$: Schottky barrier height
- W: thickness of AlGaAs layer
- $N_D$: donor concentration in AlGaAs layer
- $\Delta E_c$: energy discontinuity of the conduction band between AlGaAs and GaAs
- $\epsilon$: dielectric constant of AlGaAs A description is given of the prior art etching method.

When a solution of phosphoric acid, hydrogen peroxide, and water in a volume ratio of 3:1:50 is employed as an etching solution in FIGS. 17 and 18, the etching speeds of the n+ type GaAs layer 2 and the n type AlGaAs layer 1 are both about 30 nm/min., and therefore, when this etching solution is applied to producing a gate recess of HEMT, there arises a variation Δd in the recess depth (d) in FIGS. 17 and 18.

Since the thickness W of the AlGaAs layer 1 which appears in the formula (1) defining the threshold voltage $V_{th}$ of the HEMT, is determined by the recess depth (d), the thickness W of the AlGaAs layer 1 varies when the recess depth (d) varies as described above, resulting in a variation in the threshold voltage $V_{th}$ and in the characteristics of the HEMT.

The prior art etching solution does not have a selectivity for different materials as described above, and when it is used in producing a heterostructure device, precise control was difficult.

SUMMARY OF THE INVENTION

It is an object of the present invention to provide an etching solution for etching a semiconductor layer structure comprising GaAs/AlGaAs, GaAs/InGaAs, AlGaAs/InGaAs, InGaAs/AlGaAs, and InGaAs/GaAs, that is selective for different materials.

It is another object of the present invention to provide an etching method for performing precise and easy selective etching of a semiconductor device having the above described heterostructure, employing the above-described etching solution.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from the detailed description.

According to a first aspect of the present invention, an etching solution comprises a solution of an organic acid and hydrogen peroxide mixed in a volume ratio of 1:1 to 200:1 with a basic material being added thereto so as to produce a pH 6.0 to 8.0. An etching method comprises etching a GaAs layer selectively with respect to an AlGaAs layer for a layer structure comprising the AlGaAs layer and a GaAs layer disposed thereon. This process may be applied to a layer structure comprising an n type AlGaAs layer and an n+ type GaAs in a HEMT.

According to a second aspect of the present invention, an etching solution comprises a solution of an organic acid and hydrogen peroxide mixed in a volume ratio of 1:1 to 200:1 with a basic material being added thereto so as to produce a pH above 6.0. An etching method comprises etching a GaAs layer selectively with respect to an InGaAs layer for a layer structure comprising the InGaAs layer and a GaAs layer. This process may be applied to a layer structure comprising an n type InGaAs layer and an n+ type GaAs layer in a MESFET.

According to a third aspect of the present invention, an etching solution comprises a solution of an organic acid and hydrogen peroxide mixed in a volume ratio of 1:1 to 200:1 with a basic material being added thereto so as to produce a pH of above 7.0. An etching method comprises etching an AlGaAs layer selectively with respect to an InGaAs layer for a layer structure comprising the InGaAs layer and an AlGaAs layer. This process may be applied to a layer structure comprising a p+ type InGaAs base layer and an n type AlGaAs layer in a HEMT.

According to a fourth aspect of the present invention, an etching solution comprises a solution of an organic acid and hydrogen peroxide mixed in a volume ratio of 1:1 to 200:1 with a basic material being added thereto so as to produce a pH of 4.5 to 5.5. An etching method comprises etching an InGaAs layer selectively with respect to an AlGaAs layer for a layer structure comprising the InGaAs layer and an AlGaAs layer. This process may be applied to a layer structure comprising an n type AlGaAs emitter layer and an n type InGaAs emitter layer in an HBT.

According to a fifth aspect of the present invention, an etching solution comprises a solution of an organic acid and hydrogen peroxide mixed in a volume ratio of 1:1 to 200:1 with a basic material being added thereto so as to produce a pH of 4.5 to 5.5. An etching method comprises etching an InGaAs layer selectively with respect to a GaAs layer for a layer structure comprising the GaAs layer and an InGaAs layer. This process may be applied to a layer structure comprising an n type GaAs emitter layer and an n type InGaAs emitter layer produced thereon, of a HEMT.

According to the present invention, in etching a semiconductor material comprising two or more layers, the etching rate is differentiated dependent on the materials to be etched, thereby effecting an eminent selectivity. Furthermore, the etching method employing the above-described etching solution enables a high precision in control of the etching that affects significant influence on the characteristics of a heterostructure device.

DETAILED DESCRIPTION OF THE PREFERRED EMBODIMENTS

Embodiment 1

Figure 1:
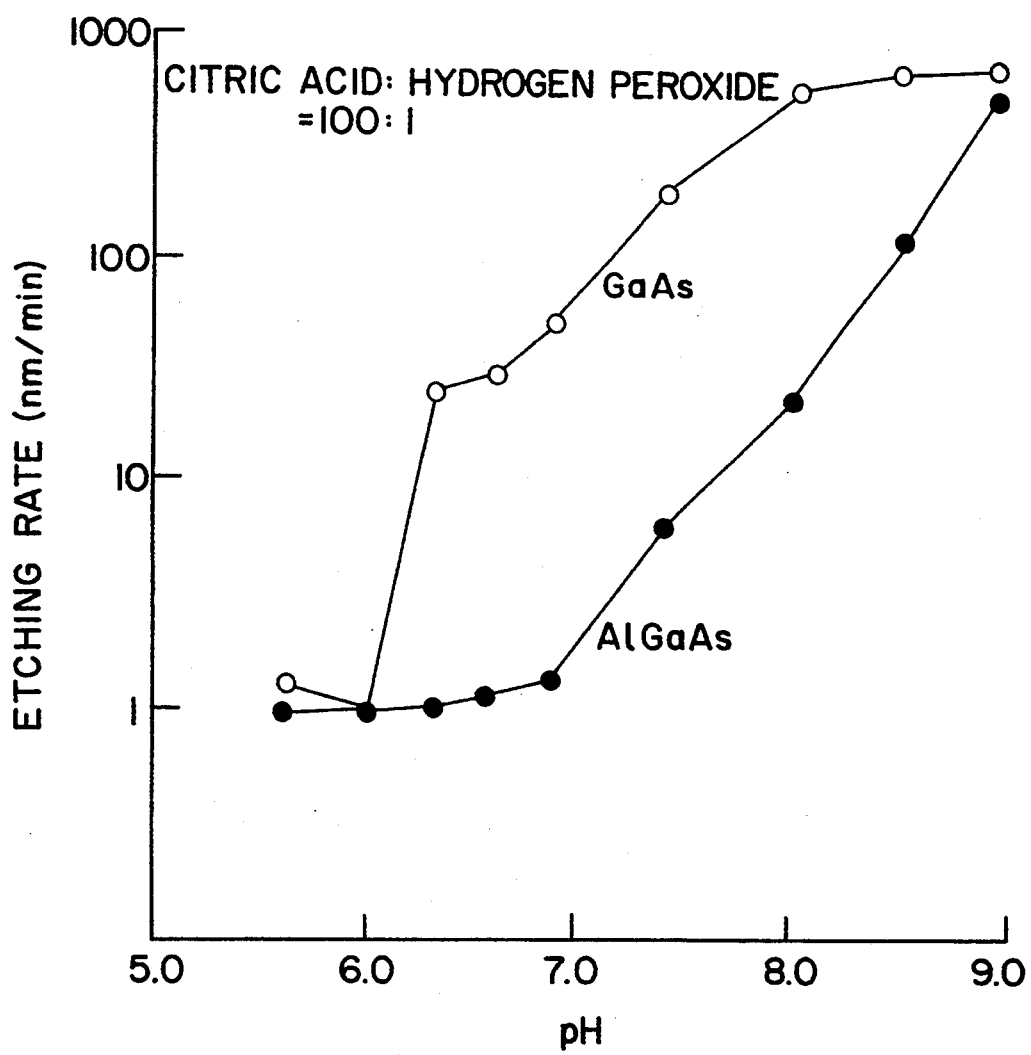
FIG. 1 is a diagram representing the pH dependency of etching rate, of an etching solution according to a first embodiment of the present invention.

FIG. 1 is a diagram for explaining an etching solution according to a first embodiment of the present invention. This figure shows the pH dependency of the etching rate of GaAs and AlGaAs in an etching solution of citric acid as an organic acid and hydrogen peroxide mixed in a volume ratio of 100:1. As the organic acid, generally known organic acids, for example, malic acid, malonic acid, oxalic acid, tartaric acid, and succinic acid may be employed in the present invention. The volume ratio of the organic acid and the hydrogen peroxide may be within a range from 1:1 to 200:1, so that it has a pH dependency of etching rate for GaAs and AlGaAs similar to that shown in FIG. 1.

Figure 2A:
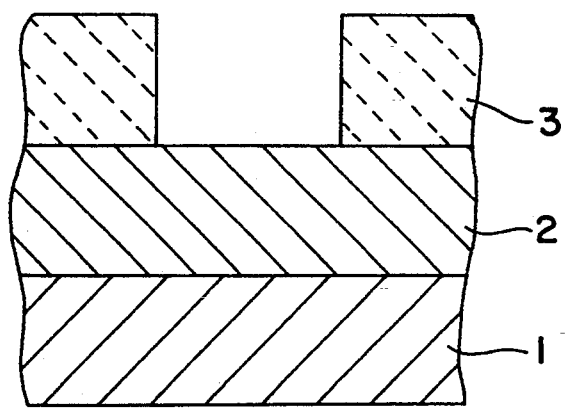
FIGS. 2(a) and 2(b) are cross sectional views for explaining an etching method according to the first embodiment of the present invention.

FIGS. 2(a) and (b) show an etching method according to a first embodiment of the present invention. In these figures, reference numeral 1 designates an n type AlGaAs layer, reference numeral 2 designates an n+ type GaAs layer, and reference numeral 3 designates photoresist.

Figure 3:
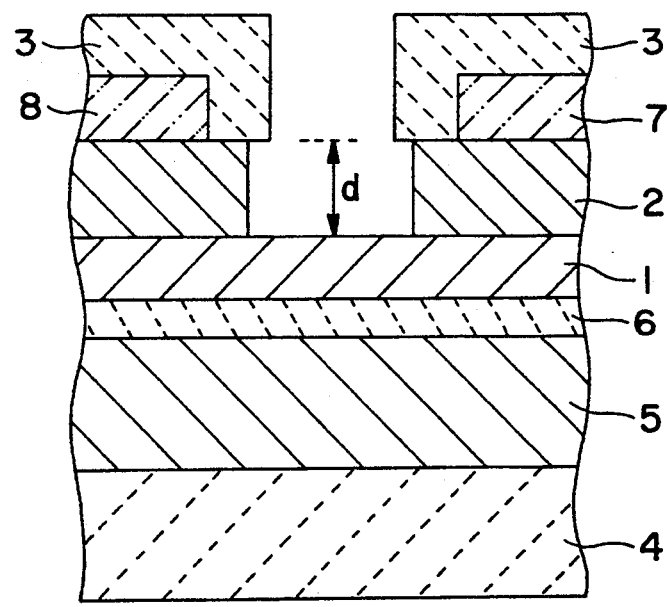
FIG. 3 is a cross sectional view for explaining recess etching of a HEMT according to the first embodiment of the present invention.

FIG. 3 is a diagram for explaining recess etching of an HEMT employing an etching solution according to a first embodiment of the present invention. In FIG. 3, reference numeral 1 designates an n type AlGaAs electron supply layer, reference numeral 2 designates an n+ type GaAs cap layer (ohmic contact layer), reference numeral 3 designates photoresist, reference numeral 4 designates a GaAs substrate, reference numeral 5 designates an i type GaAs buffer layer, reference numeral 6 designates an i type InGaAs channel layer, reference numeral 7 designates a drain electrode, and reference numeral 8 designates a source electrode.

Impurity concentrations and thicknesses of respective layers of the HEMT are shown in the following table 1.

TABLE 1

| layer | impurity concentration | thickness |
|---|---|---|
| n type AlGaAs electron supply layer 1 | $2 \times 10^{18}$ cm$^{-3}$ | 450 Å |
| n+ type GaAs cap layer 2 | $3 \times 10^{18}$ cm$^{-3}$ | 1,000 Å |
| i type GaAs buffer layer 5 | | 3,000 Å |
| i type InGaAs channel layer 6 | | 200 Å |

A description is given of the etching solution and etching method according to the first embodiment.

Figure 2B:
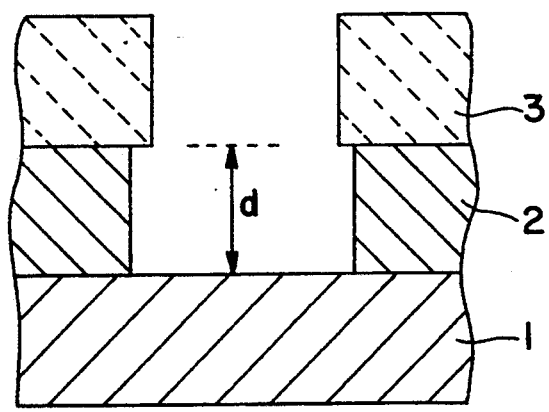

As shown in FIG. 1, when citric acid is employed as the organic acid and the volume ratio of citric acid and hydrogen peroxide is 100:1, and the pH is adjusted by adding a basic compound such as ammonia, selective etching between GaAs and AlGaAs is possible within a range of pH 6.0 to 8.0. That is, the etching rate of GaAs is large and the etching rate of AlGaAs is small in this range of pH 6.0 to 8.0, whereby GaAs is etched a lot and AlGaAs is hardly etched. In other words, as shown in FIG. 2(b), by etching the two layer structure comprising the n type AlGaAs layer 1 and the n+ type GaAs layer 2, only the n+ GaAs layer 2 is etched and the etching can be stopped just at the n type AlGaAs layer 1. This can be also applied to a case where the n+ type GaAs cap layer 2 on the n type AlGaAs electron supply layer 1 is selectively etched in recess etching of an HEMT as shown in FIG. 3. Because the etching depth (d) of the n+ type GaAs layer 2 can be controlled with high precision, the problem of variations in the threshold voltage $V_{th}$ in the prior art etching method is solved, whereby the characteristics of the HEMT are uniform.

Japanese Published Patent Application No. 63-62235 discloses a method of etching a GaAs layer selectively with respect to an AlGaAs layer using a solution comprising ammonia and hydrogen peroxide in a volume ratio of 1:750 to 1:1500. However, even when a mixture of ammonia and hydrogen peroxide that has an unadjusted pH is employed, the eminent difference in the etching rates as in this first embodiment is not obtained.

To the contrary, in this first embodiment in which the etching solution is obtained by mixing an organic acid and hydrogen peroxide in a volume ratio of 1:1 to 200:1 and adding a basic material to produce a pH of 6.0 to 8.0, an eminent difference in the etching rate is produced between the GaAs layer and the AlGaAs layer, thereby resulting an easy and high preciseness selective etching.

Embodiment 2

Figure 4:
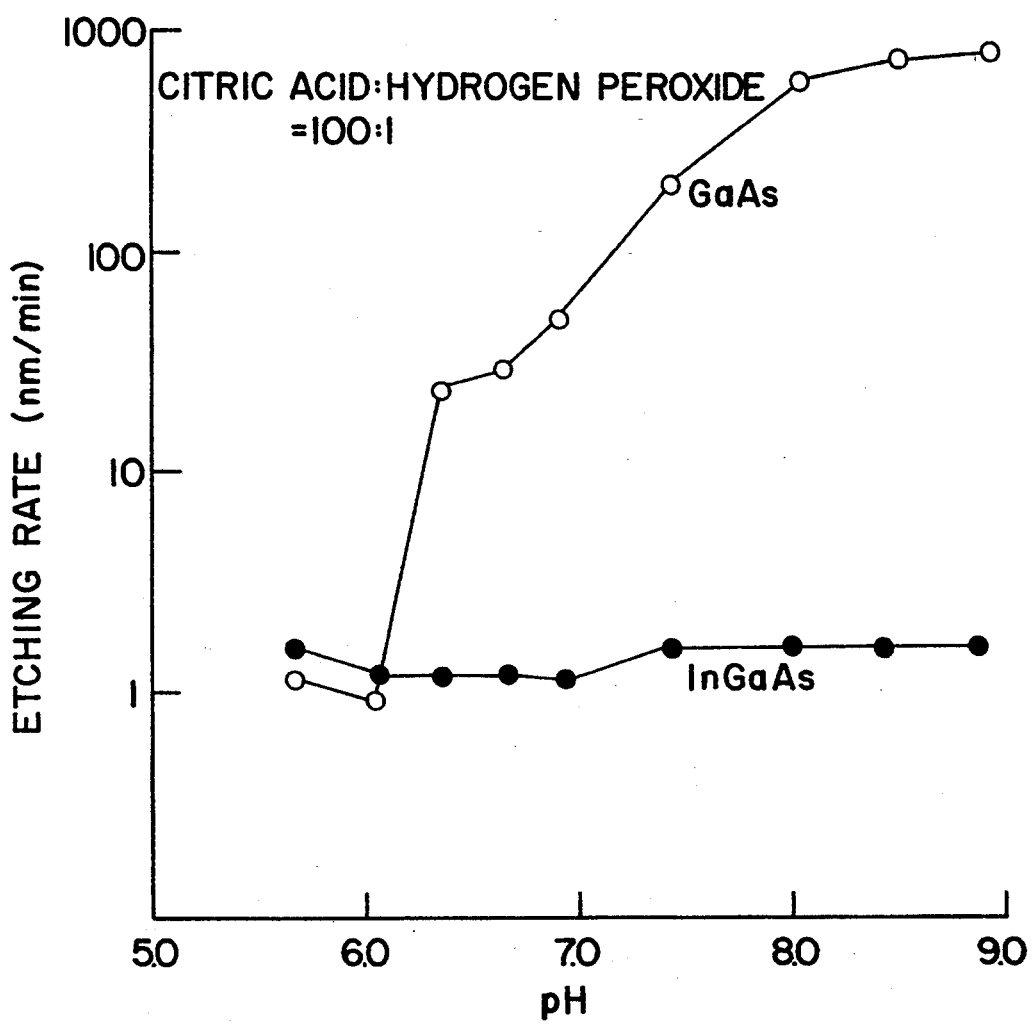
FIG. 4 is a diagram representing the pH dependency of etching rate of an etching solution according to a second embodiment of the present invention.

FIG. 4 is a diagram for explaining an etching solution according to a second embodiment of the present invention. In this second embodiment, citric acid is employed as an organic acid, and the citric acid and hydrogen peroxide are mixed in a volume ratio of 100:1. The pH dependency of the etching rates for GaAs and InGaAs are shown in the FIG. 4. While in this second embodiment citric acid is employed as in the first embodiment, the generally known organic acids mentioned for the first embodiment can also be employed. The volume ratio of the citric acid and hydrogen peroxide may be in a range of 1:1 to 200:1, and then the pH dependencies of the etching rates of GaAs and InGaAs similar to that of FIG. 4 are obtained.

Figure 5A:
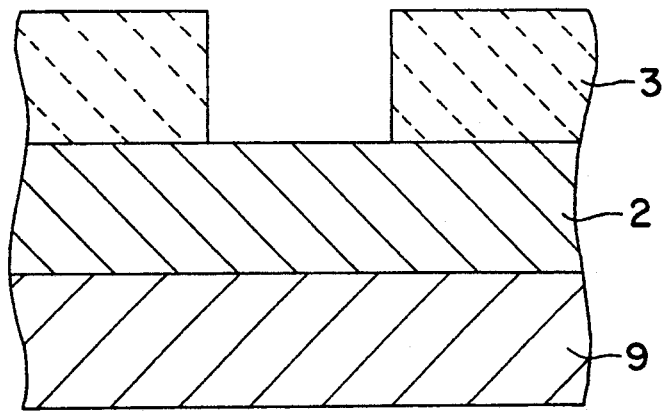
FIGS. 5(a) and 5(b) are cross sectional views for explaining an etching method according to the second embodiment of the present invention.
Figure 5B:
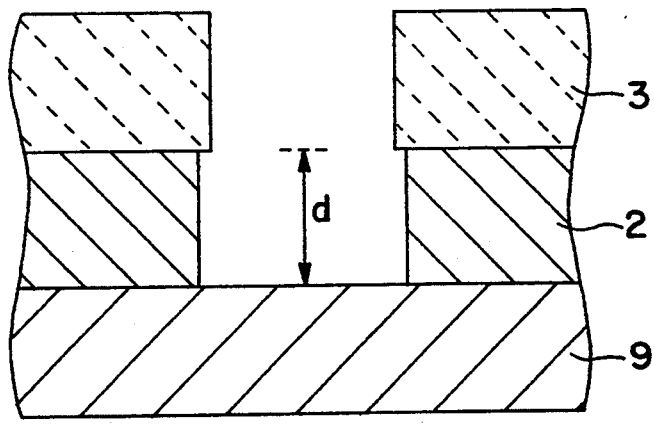

FIGS. 5(a) and 5(b) are diagrams showing an etching method according to a second embodiment of the present invention, where reference numeral 2 designates an n+ type GaAs layer, reference numeral 9 designates an n type InGaAs layer, and reference numeral 3 designates photoresist.

Figure 6:
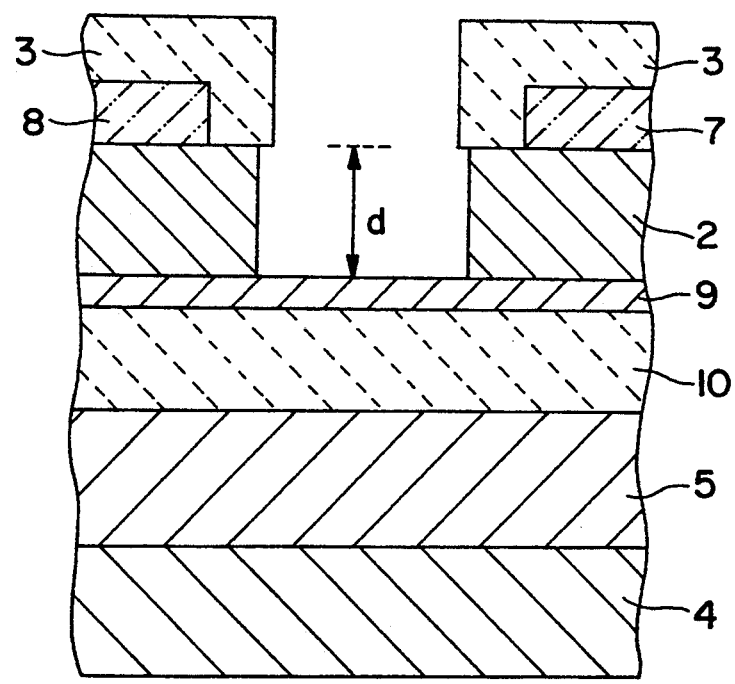
FIG. 6 is a cross sectional view for explaining recess etching of a HEMT according to the second embodiment of the present invention.

FIG. 6 is a diagram for explaining recess etching of a MESFET employing n type InGaAs as a stopper layer 9 for the etching solution according to the second embodiment, where reference numeral 3 designates photoresist, reference numeral 7 designates a drain electrode, and reference numeral 8 designates a source electrode.

The impurity concentrations and thicknesses of respective layers of this MESFET are described in the following table 2.

TABLE 2

| layer | impurity concentration | thickness |
| --- | --- | --- |
| GaAs substrate 4 | | |
| GaAs/AlGaAs super-lattice buffer layer 5 (=GaAs of 50 Å × 40/ | | 8,000 Å |

TABLE 2-continued

| layer | impurity concentration | thickness |
| --- | --- | --- |
| AlGaAs of 150 Å × 40) | | |
| n GaAs channel layer 10 | $3 \times 10^{17}$ cm$^{-3}$ | 1,500 Å |
| n type InGaAs stopper layer 9 | $2 \times 10^{17}$ cm$^{-3}$ | 100 to 200 Å |
| n+ type GaAs cap layer 2 | $2 \times 10^{18}$ cm$^{-3}$ | 1,000 to 3,000 Å |

The threshold voltage $V_{th}$ of this MESFET will be represented as follows:

$$V_{th} = V_{bi} - \frac{qN_D a^2}{2\epsilon_s} \quad (2)$$

where
 $V_{bi}$: built-in potential
 q: electron charge
 $N_D$: donor concentration
 a: active layer thickness (corresponding to the thickness of 9 and 10 of FIG. 6)
 $\epsilon_s$: dielectric constant.

Next, the etching solution and the etching method of the second embodiment will be described.

As shown in FIG. 4, when citric acid is employed as the organic acid, the citric acid and hydrogen peroxide are mixed in a volume ratio of 100:1, and the pH is adjusted to be in a range of pH above 6.0 by adding, for example, a basic compound such as ammonia, selective etching between GaAs and InGaAs is made possible. In other words, in this range of pH above 6.0, the etching rate of GaAs is large and the etching rate of InGaAs is small, whereby GaAs is etched a lot and InGaAs is hardly etched. Thus, by etching the two layer structure of n type InGaAs layer 9 and n+ type GaAs layer 2 employing photoresist 3 as a mask as shown in FIG. 5, only the n+ GaAs layer 2 is etched and the etching is stopped just at the n type InGaAs layer 9.

This etching process can be applied where recess etching of a MESFET is performed using the InGaAs layer as a stopper layer 9 as shown in FIG. 6. Then, the etching depth (d) can be controlled with high precision, whereby the active layer thickness (a) (the thickness of layers of InGaAs stopper layer 9 and n type GaAs layer 10 in FIG. 6) becomes uniform, thereby solving the problem of variations in the threshold voltage $V_{th}$ due to the variations in the active layer thickness (a), as in the formula (2) representing the threshold voltage $V_{th}$ of the MESFET.

As a selective etching method for a layer structure comprising a GaAs layer and an InGaAs layer of an HEMT or a MESFET that require a high precision control, disclosed in Japanese Published Patent Application No. 2-206117 is a method in which solution of citric acid, hydrogen peroxide, and water is employed. An AlAs layer is formed between a GaAs layer and an InGaAs layer as an etch stopping layer in a thickness of about 30 Å that does not prevent the flow of electrons. In this method, however, providing a process step of forming an AlAs layer in the fabrication process of the HEMT or MESFET unfavourably increases the number of process steps, thereby complicating the fabrication process.

On the contrary, in the second embodiment of the present invention, because the etching solution is adjusted to have a pH value of above 6.0 by adding a basic compound to the solution of an organic acid and hydrogen peroxide mixed in a volume ratio of 1:1 to 200:1, an AlAs layer is not required to be formed between the GaAs layer and the InGaAs layer, thereby enabling selective etching easily and with high precision.

Embodiment 3

Figure 7:
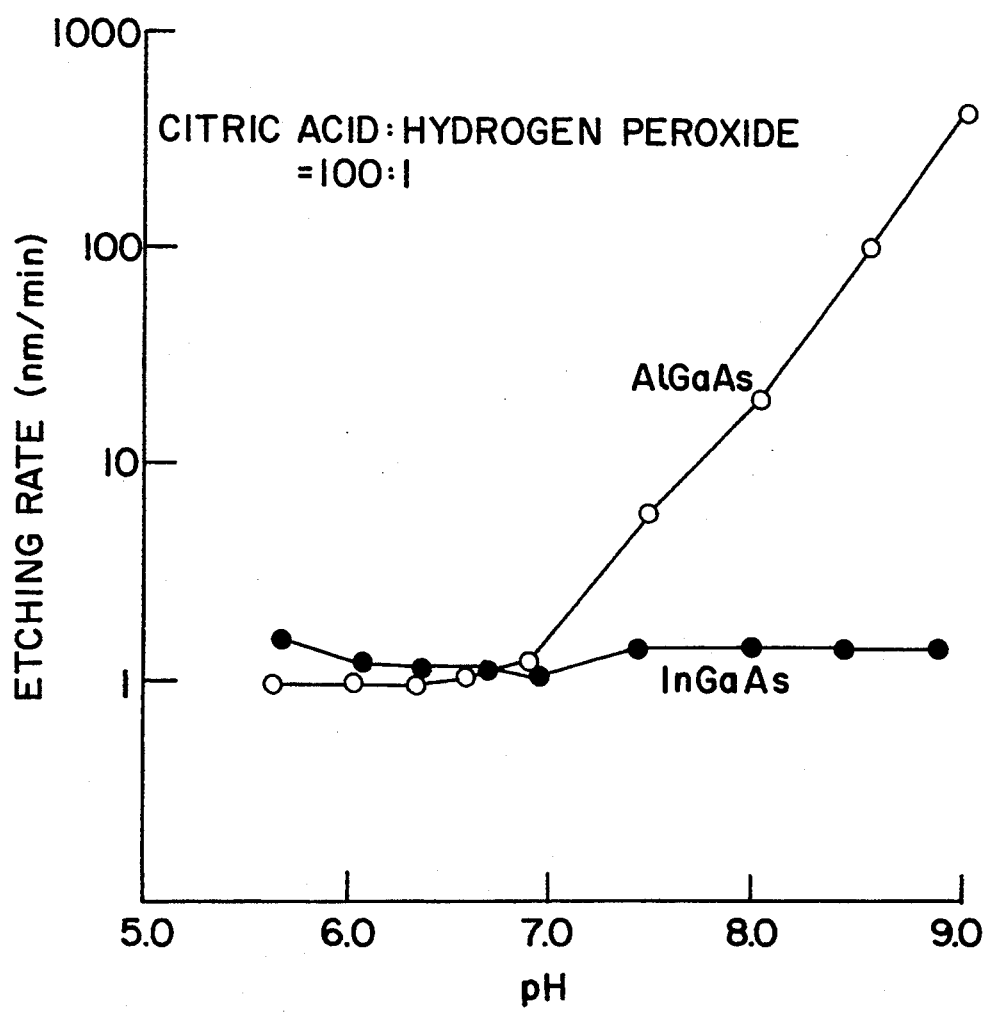
FIG. 7 is a diagram representing the pH dependency of etching rate of an etching solution according to a third embodiment of the present invention.

FIG. 7 is a diagram for explaining an etching solution according to a third embodiment of the present invention, and shows the pH dependency of the etching rates of AlGaAs and InGaAs, of a solution which is a solution of citric acid and hydrogen peroxide mixed in a volume ratio of 100:1. Similar to the first and second embodiments, a generally known organic acid may be employed, but in this third embodiment citric acid is employed. The etching solution of organic acid and hydrogen peroxide mixed in a volume ratio within a range of 1:1 to 200:1, shows the pH dependency of etching rate for AlGaAs and InGaAs similar to that shown in FIG. 7.

Figure 8A:
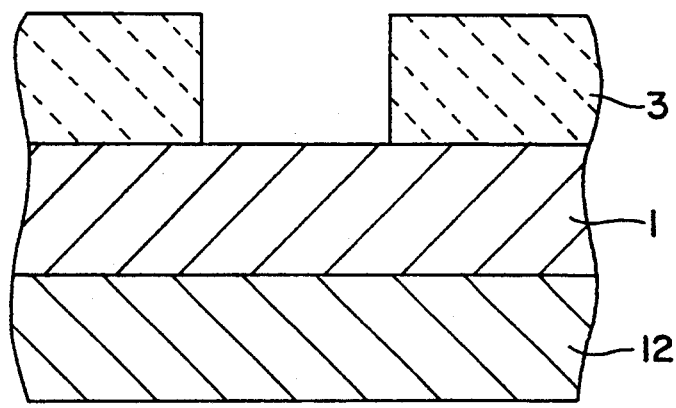
FIGS. 8(a) and 8(b) are cross sectional views explaining an etching method according to the third embodiment of the present invention.
Figure 8B:
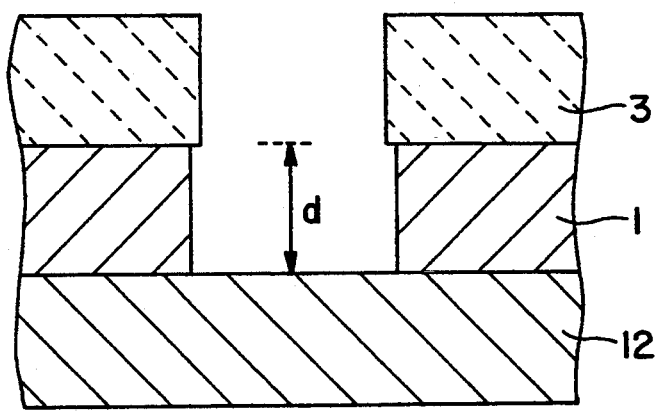

FIGS. 8(a) and 8(b) are diagrams showing an etching method according to the third embodiment of the present invention. Reference numeral 1 designates an n type AlGaAs layer, reference numeral 12 designates a p type InGaAs layer, and reference numeral 3 designates photoresist.

Figure 9:
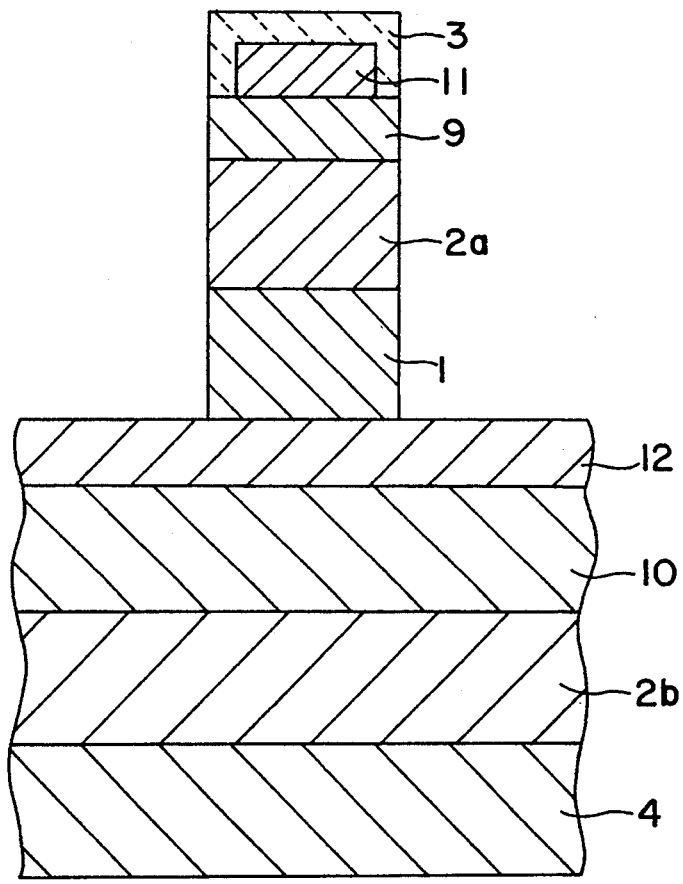
FIG. 9 is a cross sectional view for explaining a surface exposing etching process of an HBT according to the third embodiment of the present invention.

FIG. 9 is a diagram for explaining the base surface exposing etching of an HBT, where reference numeral 11 designates an emitter electrode and reference numeral 3 designates photoresist.

The impurity concentrations and the thicknesses of the respective layers of this HBT are as in the following table 3.

TABLE 3

| layer | impurity concentration | thickness |
| --- | --- | --- |
| GaAs substrate 4 | | |
| n+ type GaAs collector contact layer 2b | $2 \times 10^{18}$ cm$^{-3}$ | 2,000 Å |
| n− type GaAs collector layer 10 | $2 \times 10^{17}$ cm$^{-3}$ | 2,000 Å |
| p+ type InGaAs base layer 12 | $1 \times 10^{19}$ cm$^{-3}$ | 500 Å |
| n type AlGaAs emitter layer 1 | $5 \times 10^{17}$ cm$^{-3}$ | 500 Å |
| n type GaAs emitter layer 2b | $2 \times 10^{18}$ cm$^{-3}$ | 1,000 Å |
| InGaAs emitter contact layer 9 | $2 \times 10^{18}$ cm$^{-3}$ | 2,000 Å |

Figure 10:
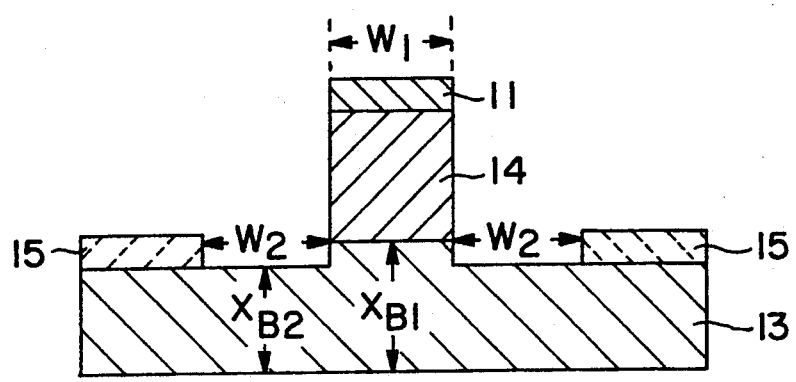
FIG. 10 is a diagram for explaining the external base resistance in surface exposing etching of an HBT according to the third embodiment of the present invention.

FIG. 10 is a diagram for explaining that the external base resistance increases when the base surface exposing etching is performed in the conventional technique, where reference numeral 11 designates an emitter electrode, reference numeral 13 designates a base layer, reference numeral 14 designates an emitter layer, and reference numeral 15 designates a base electrode.

The etching solution and the etching method of this third embodiment will be described as in the following.

As shown in FIG. 7, when citric acid and hydrogen peroxide are mixed in a volume ratio of 100:1, and a basic compound such as ammonia is added thereto to adjust the pH to be above 7.0, selective etching of AlGaAs and InGaAs is enabled. In other words, in the range of pH above 7.0, the etching rate of AlGaAs is large and the etching rate of InGaAs is small, thereby enabling large etching AlGaAs while the etching InGaAs is small. That is, as shown in FIG. 8(b), by etching the two layer structure of p+ InGaAs layer 12 and n AlGaAs layer 1, only n type AlGaAs layer 1 is etched and the etching stop just at the p+ InGaAs layer 12. This can be used in the base surface exposing etching of HBT as shown in FIG. 9, and the etching depth of n type AlGaAs layer 1 can be controlled at high precision, whereby the p+ type InGaAs base layer 12 is hardly overetched.

The base resistance $R_B$ in the HBT is represented by the following formula (3), $$R_B = \frac{\rho B \cdot W1}{X_{B1} \cdot Z_E} + \frac{\rho B \cdot W2}{2X_{B2} \cdot Z_E}, \quad (3)$$

where $Z_E$ is emitter length.

When performing base surface exposing etching in the prior art, the external base resistance in the second term in the formula (3) increases because the base layer 13 is overetched, and thereby the $X_{B2}$ increases, whereby device characteristic, such as the maximum oscillation frequency, is reduced. On the contrary, in the third embodiment of the present invention, by high selectivity etching of AlGaAs/InGaAs employing the above-described etching solution, the etching can be stopped at the upper surface of the base layer 13 of the HBT, whereby the increase of an external base resistance is prevented.

Embodiment 4

Figure 11:
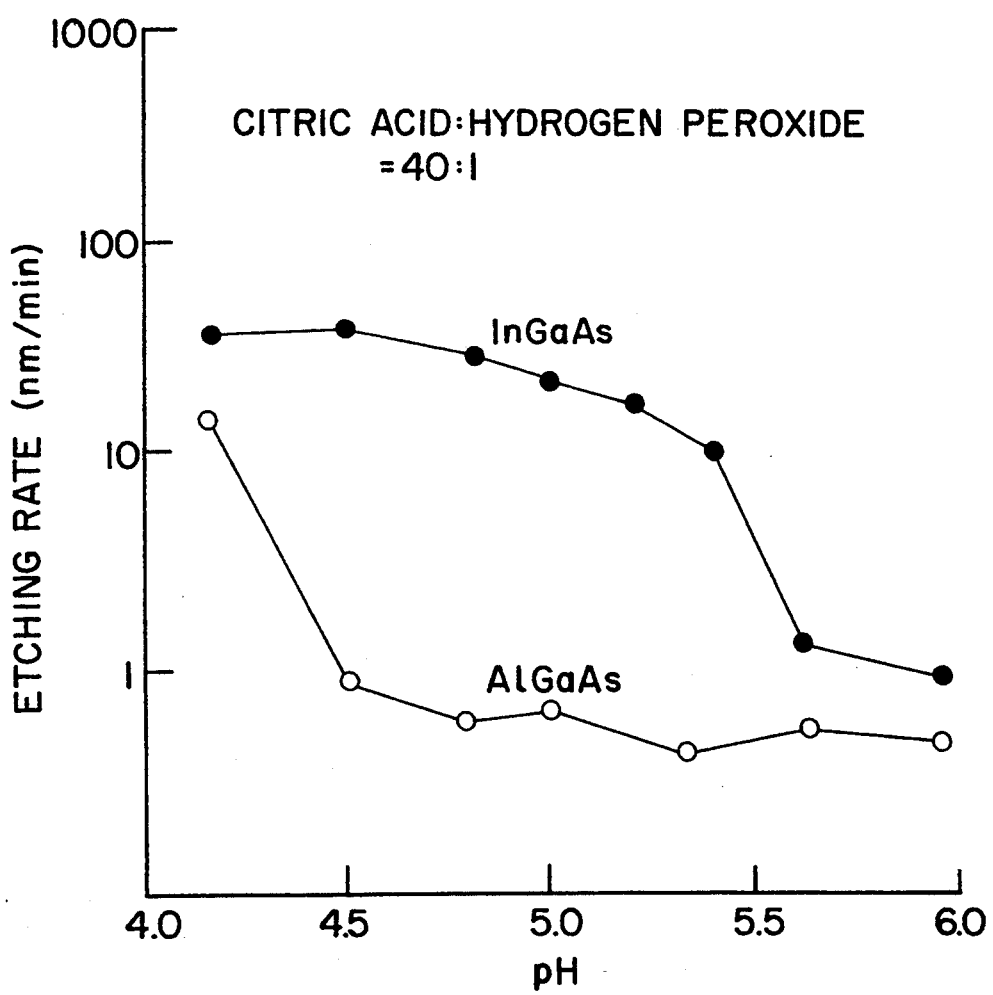
FIG. 11 is a diagram representing the pH dependency of etching rate of an etching solution according to a fourth embodiment of the present invention.

FIG. 11 is a diagram for explaining an etching solution according to a fourth embodiment of the present invention, and the pH dependency of the etching rate for InGaAs and AlGaAs, of a solution employing citric acid as the organic acid. Citric and hydrogen peroxide are mixed in a volume ratio of 40:1. As in the first, the second, and the third embodiments, while citric acid is employed in this fourth embodiment, a generally known organic acid may be employed as the organic acid. The volume ratio of the organic acid and the hydrogen peroxide may be in a range of 1:1 to 200:1, presenting a similar pH dependency of the etching rate against AlGaAs and InGaAs as that shown in FIG. 11.

Figure 12A:
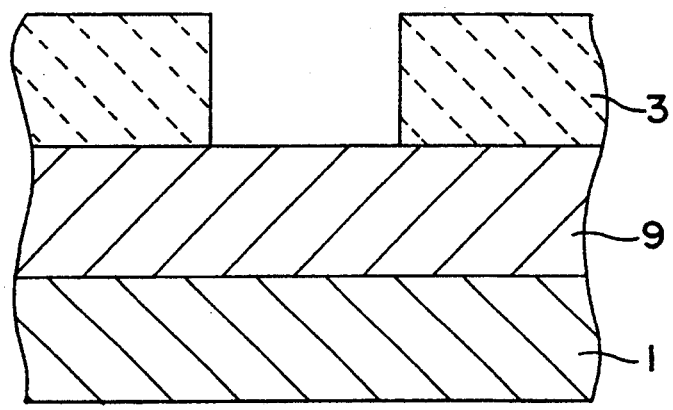
FIGS. 12(a) and 12(b) are cross sectional views for explaining the etching method according to the fourth embodiment of the present invention.
Figure 12B:
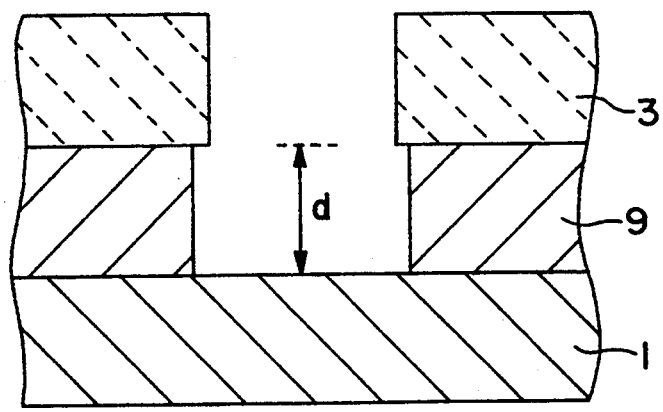

FIGS. 12(a) and 12(b) are diagrams for explaining an etching solution according to a fourth embodiment of the present invention, where reference numeral 1 designates an n type AlGaAs layer, reference numeral 9 designates an InGaAs layer, and reference numeral 3 designates photoresist.

Figure 13A:
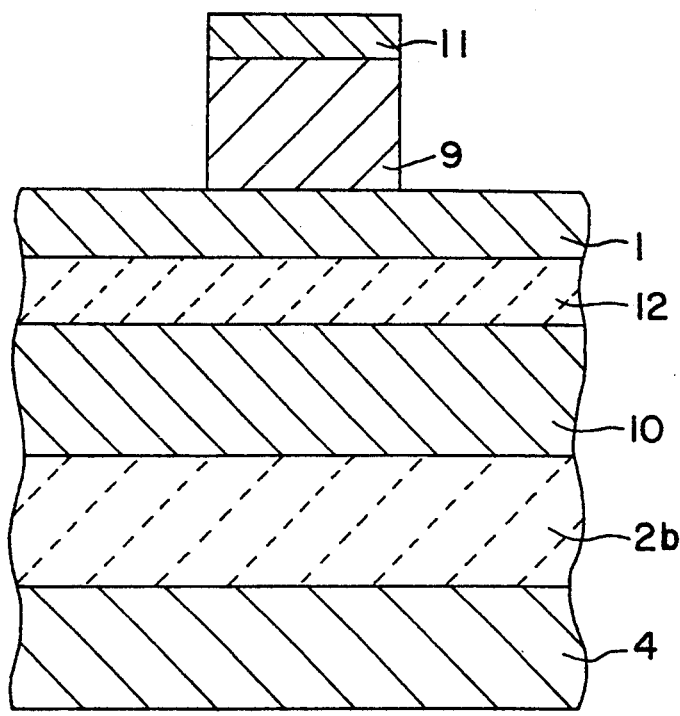
FIGS. 13(a) and 13(b) are cross sectional views for explaining an HBT including an emitter layer that is depleted according to the fourth embodiment of the present invention.
Figure 13B:
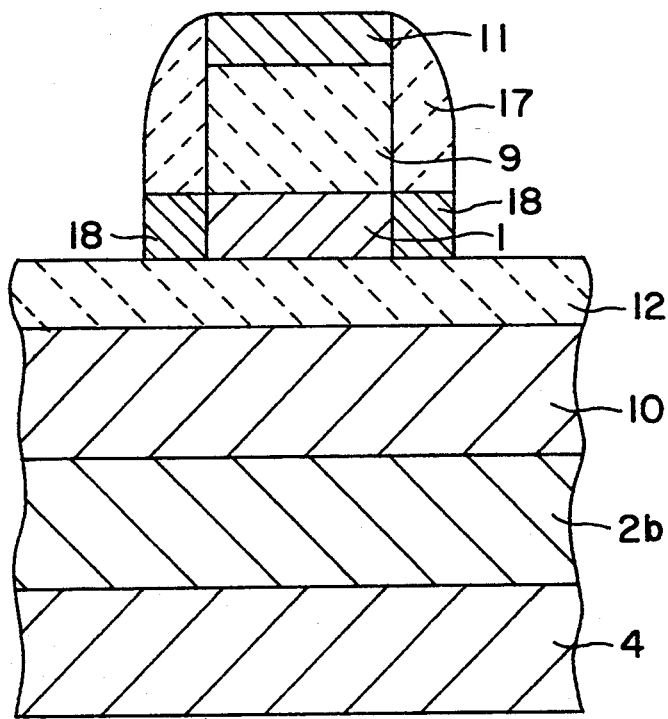

FIG. 13(a) and 13(b) are diagrams for explaining a method for producing a depleted emitter layer of an HBT. In FIGS. 13(a) and 13(b), reference numeral 11 designates an emitter electrode, reference numeral 17 designates an SiO$_2$ side wall, and reference numeral 18 designates an AlGaAs emitter layer that is depleted.

The impurity concentrations and the thicknesses of the layers of the HBT are shown in the following table 4.

TABLE 4

| layer | impurity concentration | thickness |
| --- | --- | --- |
| GaAs substrate 4 | | |
| n+ type GaAs collector contact layer 2b | $2 \times 10^{18}$ cm$^{-3}$ | 2,000 Å |
| n− type GaAs collector layer 10 | $1 \times 10^{17}$ cm$^{-3}$ | 2,000 Å |
| p+ type InGaAs base layer 12 | $1 \times 10^{19}$ cm$^{-3}$ | 500 Å |
| n type AlGaAs emitter layer 1 | $5 \times 10^{17}$ cm$^{-3}$ | 500 Å |

TABLE 4-continued

| layer | impurity concentration | thickness |
|---|---|---|
| InGaAs emitter layer 9 | $2 \times 10^{18}$ cm$^{-3}$ | 1,000 Å |

A description is given of the etching solution and the etching method of the fourth embodiment.

As shown in FIG. 11, when the volume ratio of the citric acid and the hydrogen peroxide is 40:1, and a basic compound such as ammonia is added thereto to adjust the pH to be 4.5 to 5.5, selective etching between InGaAs and AlGaAs is enabled.

That is, in the range of pH 4.5 to 5.5, the etching rate of InGaAs is large and the etching rate of AlGaAs is small, whereby InGaAs is significantly etched and AlGaAs is hardly etched. Therefore, as shown in FIG. 12(b), when etching is performed to the two layer structure of n type AlGaAs layer 1 and InGaAs layer 9 using the photoresist 3 as a mask, only the InGaAs layer 9 is etched with the etching stopped at the n type AlGaAs layer 1.

In producing, for example, an AlGaAs emitter layer 18 of an HBT that is depleted, it is possible to employ the etching solution of the fourth embodiment and the etching solution of the third embodiment as shown in FIGS. 13(a) and 13(b) and as described below:

When etching is performed employing an etching solution of the fourth embodiment to the InGaAs emitter layer 9 using an emitter electrode 11 as a mask as shown in FIG. 13(a), the etching is stopped just at the n type AlGaAs layer 1, whereby the etching depth can be controlled with high precision.

After producing SiO$_2$ side wall 17 at the side walls of the emitter layer 9 and the emitter electrode 11, the AlGaAs emitter layer 1 is etched employing the etching solution according to the third embodiment as shown in FIG. 13(b), and an AlGaAs layer 18 that is depleted is produced.

In this fourth embodiment, high selectivity etching of InGaAs/AlGaAs is performed using the above-described etching solutions, whereby an AlGaAs emitter layer 18 of an HBT that is depleted can be produced easily and with high precision.

Embodiment 5

Figure 14:
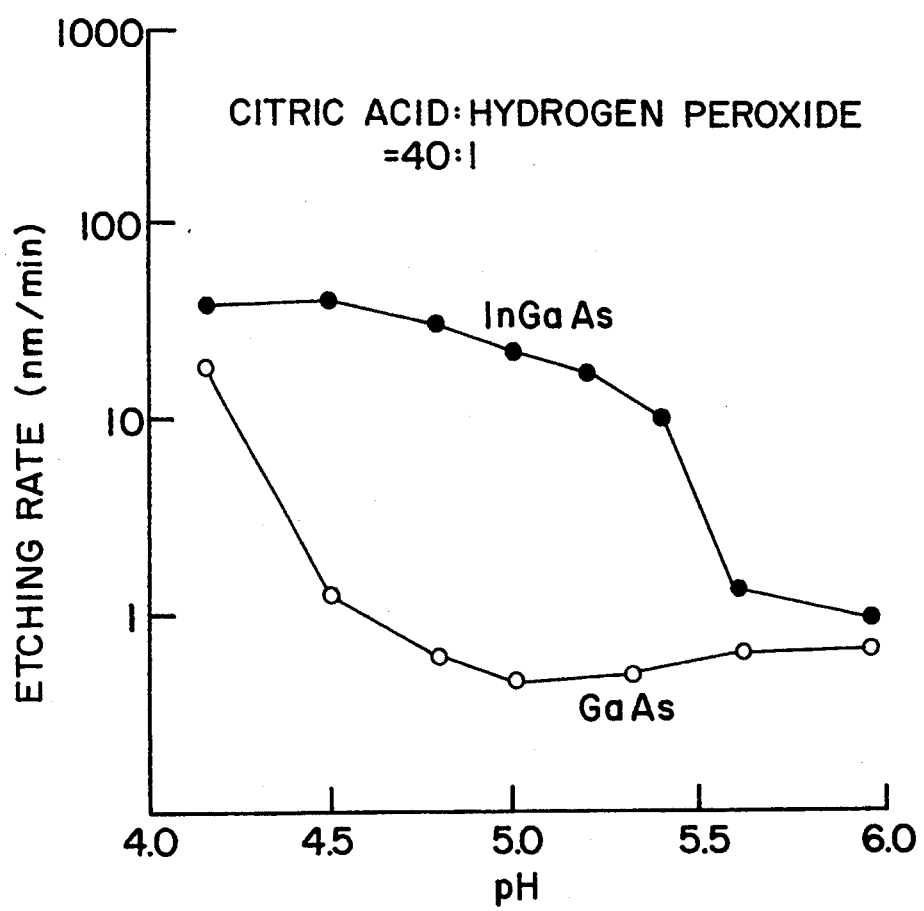
FIG. 14 is a diagram representing the pH dependency of etching rate of an etching Solution according to a fifth embodiment of the present invention.

FIG. 14 is a diagram for explaining an etching solution according to a fifth embodiment of the present invention. FIG. 14 shows the pH dependency of the etching rate for InGaAs and GaAs of an etching solution of the citric acid and hydrogen peroxide mixed in a volume ratio of 40:1. As in the first to fourth embodiments, while citric acid is employed in this fifth embodiment, generally known organic acids can be employed as the organic acid. The volume ratio of the organic acid and the hydrogen peroxide may be in a range of 1:1 to 200:1, thereby presenting a pH dependency of the etching rate of AlGaAs and InGaAs similar to that shown in FIG. 14.

Figure 15A:
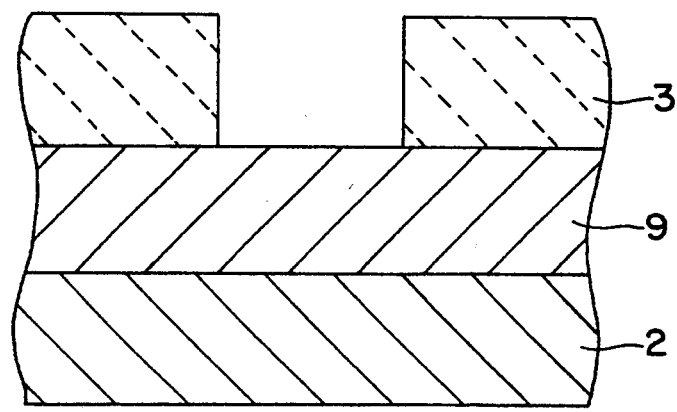
FIGS. 15(a) and 15(b) are cross sectional views for explaining an etching method according to the fifth embodiment of the present invention.
Figure 15B:
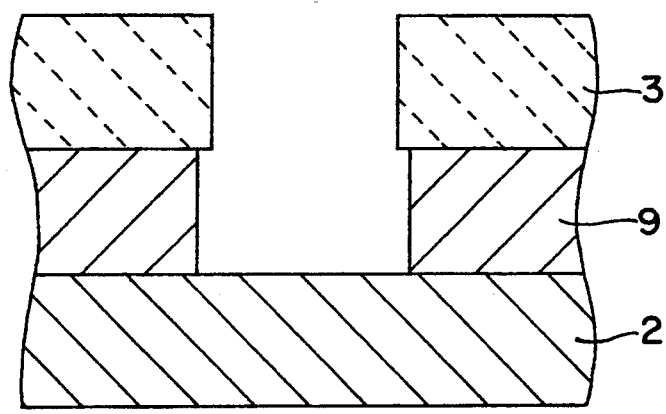

FIGS. 15(a) and 15(b) show an etching method according to a fifth embodiment of the present invention. In FIGS. 15(a) and 15(b), reference numeral 2 designates an n+ type GaAs layer, reference numeral 9 designates an InGaAs layer, and reference numeral 3 designates photoresist.

Figure 16:
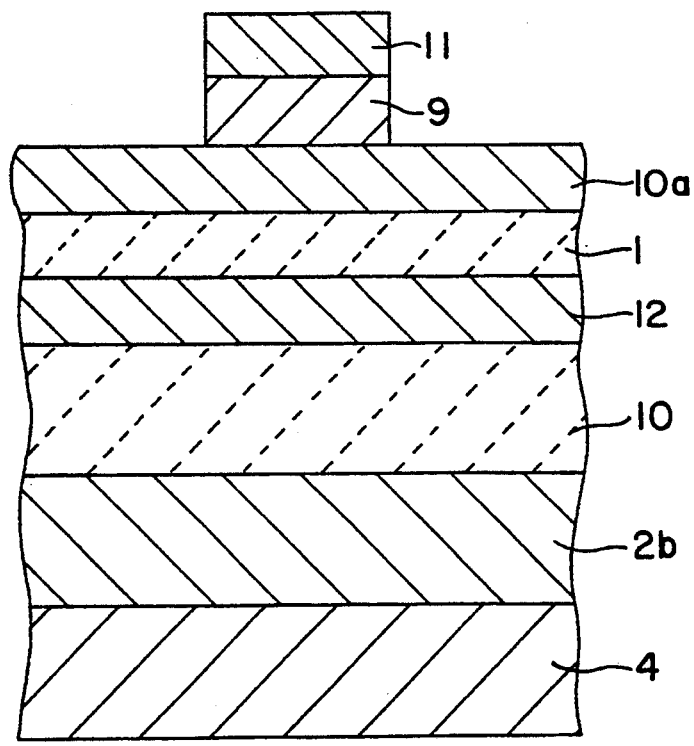
FIG. 16 is a cross sectional view for explaining the etching of the emitter layer of the HBT according to the fifth embodiment of the present invention.
Figure 17:
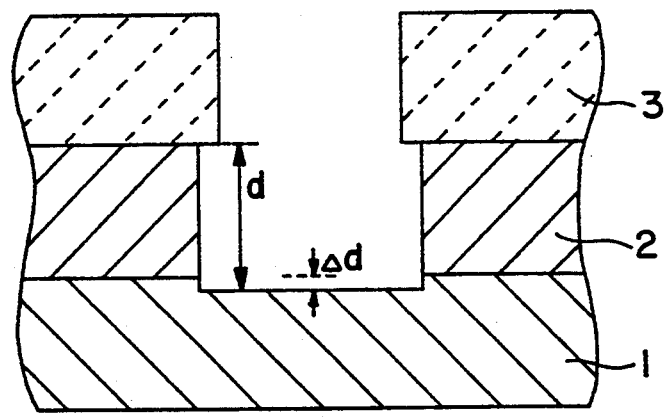
FIG. 17 is a cross sectional view for explaining a prior art etching method.
Figure 18:
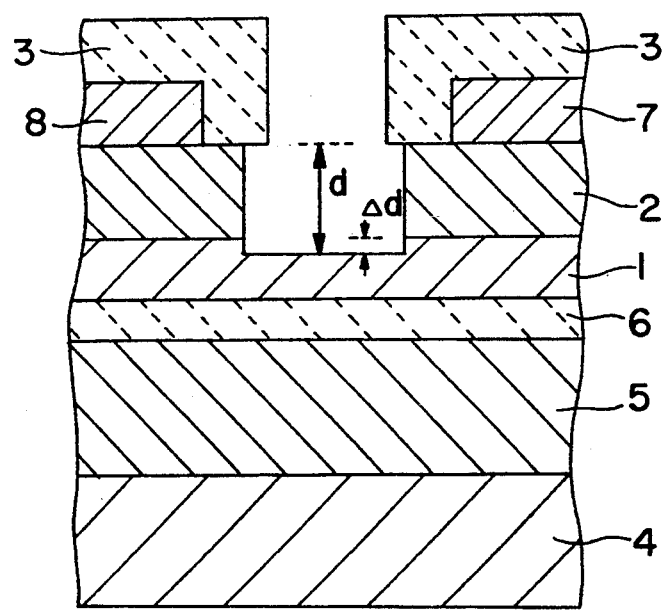
FIG. 18 is a cross sectional view for explaining the recess etching of the prior art HEMT.

FIG. 16 is a diagram for explaining the etching of an emitter layer of an HBT, where reference numeral 11 designates an emitter electrode.

The impurity concentrations and the thicknesses of respective layers of this HBT are shown below.

TABLE 5

| layer | impurity concentration | thickness |
|---|---|---|
| GaAs substrate 4 | | |
| n+ type GaAs collector contact layer 2b | $2 \times 10^{18}$ cm$^{-3}$ | 2,000 Å |
| n− type GaAs collector layer 10 | $1 \times 10^{17}$ cm$^{-3}$ | 2,000 Å |
| p+ type InGaAs base layer 12 | $1 \times 10^{19}$ cm$^{-3}$ | 500 Å |
| n type AlGaAs emitter layer 1 | $5 \times 10^{17}$ cm$^{-3}$ | 500 Å |
| n type GaAs emitter layer 10a | $2 \times 10^{18}$ cm$^{-3}$ | 1,000 Å |
| InGaAs emitter layer 9 | $2 \times 10^{18}$ cm$^{-3}$ | 1,000 Å |

A description is given of the etching solution and the etching method of this fifth embodiment.

As shown in-FIG. 14, when citric acid is employed as the organic acid, the citric acid and the hydrogen peroxide are mixed in a volume ratio of 40:1, and a basic compound such as ammonia is added thereto to adjust the pH to be 4.5 to 5.5, selective etching of InGaAs and GaAs is enabled. In other words, in the range of pH 4.5 to 5.5, the etching rate of InGaAs is large and the etching rate of GaAs is small, whereby InGaAs can be significantly etched while GaAs is hardly etched. Therefore, in the two layer structure of n type GaAs layer 10 and InGaAs layer 9, only the InGaAs layer 9 is etched by the above-described solution using the photoresist 3 as a mask, and etching stops just at the n type GaAs layer 10 as shown in FIG. 15(b). When etching of the InGaAs emitter layer 9 of the HBT is performed as shown in FIG. 16, the InGaAs emitter layer 9 can be etched easily and with high precision, selectively, with respect to the n type GaAs emitter layer 10a, whereby the characteristics of the HBT are uniform.

In this fifth embodiment, high selectivity etching of InGaAs/GaAs can be performed using the above-described etching solution, whereby a heterostructure device such as HBT can be produced.

As described above, according to the etching solution and the etching method of the present invention, an organic acid and hydrogen peroxide are mixed in a volume ratio of 1:1 to 200:1 and a basic material is added thereto, thereby to adjust the pH, providing an etching solution presenting an eminent difference in the etching rates of GaAs/AlGaAs, GaAs/InGaAs, AlGaAs/InGaAs, InGaAs/AlGaAs, and InGaAs/GaAs is obtained, enabling high selectivity etching easily and with high precision. Thereby, precise control of etching for a heterostructure semiconductor is achieved.

What is claimed is:

1. An etching method for etching a GaAs layer selectively with respect to an AlGaAs layer comprising etching with a solution comprising a mixture of an organic acid and hydrogen peroxide mixed in a volume ratio of 1:1 to 200:1 and including a basic material in sufficient quantity so that the solution has a pH of 6.0 to 8.0.

2. The etching method of claim 1 including mixing the organic acid and the hydrogen peroxide in a volume ratio of 100:1.

3. The etching method of claim 1 including etching a layer structure comprising an n type AlGaAs layer and an n+ type GaAs layer disposed on said n type AlGaAs layer in a high electron mobility transistor.

4. An etching method for etching a GaAs layer selectively with respect to an InGaAs layer comprising etching with a solution comprising a mixture of an organic acid and hydrogen peroxide mixed in a volume ratio of 1:1 to 200:1 and including a basic material in sufficient quantity so that the solution has a pH exceeding 6.0.

5. The etching method of claim 4, where the organic acid and the hydrogen peroxide are mixed in a volume ratio of 100:1.

6. The etching method of claim 4 including etching a layer structure comprising an n type InGaAs layer and an n+ type GaAs layer on said n type InGaAs layer in a metal semiconductor field effect transistor.

7. An etching method for etching an AlGaAs layer selectively with respect to an InGaAs layer comprising etching with a solution comprising a mixture of an organic acid and hydrogen peroxide mixed in a volume ratio of 1:1 to 200:1 and including a basic material in sufficient quantity so that the solution has a pH exceeding 7.0.

8. The etching method of claim 7 including mixing the organic acid and the hydrogen peroxide in a volume ratio of 100:1.

9. The etching method of claim 7 including etching a layer structure comprising a p+ type InGaAs layer and an n+ type AlGaAs emitter layer on said p+ type InGaAs layer in a heterojunction bipolar transistor.

10. An etching solution for etching a GaAs layer selectively with respect to an AlGaAs layer comprising a solution of an organic acid and hydrogen peroxide mixed in a volume ratio of 1:1 to 200:1 and including a basic material in sufficient quantity so that the solution has a pH of 6.0 to 8.0.

11. The etching solution of claim 1, where the organic acid and the hydrogen peroxide are mixed in a volume ratio of 100:1.

12. An etching solution for etching a GaAs layer selectively with respect to an InGaAs layer comprising a solution of an organic acid and hydrogen peroxide mixed in a volume ratio of 1:1 to 200:1 and including a basic material in sufficient quantity so that the solution has a pH exceeding 6.0.

13. The etching solution of claim 12, where the organic acid and the hydrogen peroxide are mixed in a volume ratio of 100:1.

14. An etching solution for etching an AlGaAs layer selectively with respect to an InGaAs layer comprising a solution of an organic acid and hydrogen peroxide mixed in a volume ratio of 1:1 to 200:1 and including a basic material in sufficient quantity so that the solution has a pH exceeding 7.0.

15. The etching solution of claim 14, where the organic acid and the hydrogen peroxide are in a volume ratio of 100:1.

* * * * *